US012724057B2

(12) United States Patent
Xu et al.

(10) Patent No.: US 12,724,057 B2
(45) Date of Patent: Sep. 1, 2026

(54) APPARATUS AND METHODS FOR TESTING COMPUTING DEVICE WIRELESS FUNCTIONALITY

(71) Applicant: Communications Test Design, Inc., West Chester, PA (US)

(72) Inventors: Yifei Xu, West Chester, PA (US); Paul Casale, West Chester, PA (US); Matthew Parsons, West Chester, PA (US)

(73) Assignee: Communications Test Design, Inc., West Chester, PA (US)

( * ) Notice: Subject to any disclaimer, the term of this patent is extended or adjusted under 35 U.S.C. 154(b) by 517 days.

(21) Appl. No.: 18/332,340

(22) Filed: Jun. 9, 2023

(65) Prior Publication Data

US 2024/0410925 A1 Dec. 12, 2024

(51) Int. Cl.
*G01R 31/00* (2006.01)
*G01R 29/08* (2006.01)

(52) U.S. Cl.
CPC ....... *G01R 31/001* (2013.01); *G01R 29/0878* (2013.01)

(58) Field of Classification Search
CPC .......................... G01R 31/001; G01R 29/0878
See application file for complete search history.

(56) References Cited

U.S. PATENT DOCUMENTS

2005/0186914 A1 8/2005 Heaton et al.
2012/0256639 A1 10/2012 Pausini et al.
2013/0250781 A1 9/2013 Gilmartin
2019/0331718 A1* 10/2019 Cummings ........ G01R 29/0878
2021/0281553 A1 9/2021 Ward et al.

OTHER PUBLICATIONS

International Search Report and Written Opinion issued for PCT/US2023/068436 issued Nov. 20, 2023, 20 pages.

* cited by examiner

*Primary Examiner* — Ayodeji O Ayotunde
(74) *Attorney, Agent, or Firm* — Duane Morris LLP

(57) ABSTRACT

This application relates to apparatus and methods for testing the wireless functionality of a plurality of devices under test. In one example, a testing system includes a testing frame with multiple radio frequency (RF) shielded cabinets. Each of the RF shielded cabinets may house an antenna and a device under test. In addition, an electrical circuit couples a wireless simulation system to the antennas. The electrical circuit includes an RF combiner configured to combine two cellular signals from the wireless simulation system to output a combined cellular signal. The electrical circuit also includes an amplifier configured to receive the combined cellular signal and output an amplified cellular signal. Further, the electrical circuit includes an RF splitter configured to receive the amplified cellular signal and provide the amplified cellular signal to each of the plurality of antennas located within the RF shielded cabinets of the testing system.

16 Claims, 7 Drawing Sheets

APPARATUS AND METHODS FOR TESTING COMPUTING DEVICE WIRELESS FUNCTIONALITY

TECHNICAL FIELD OF THE DISCLOSURE

The disclosed embodiments relate generally to apparatus and methods for testing computing devices, and more particularly, to testing the wireless functionality of computing devices.

BACKGROUND

Computing devices, such as smartphones, personal computers, laptops, and tablets, among others, are widespread and employed for personal use as well as business use across a multitude of industries. These computing devices often must be tested. For instance, before a customer purchases a new computing device, the new computing device may be tested to verify its functionality. As another example, before reselling a refurbished computing device, the computing device may be tested to assure its functioning properly. Testing may include verifying various hardware and software features of the computing devices. These processes, however, can be complicated, time consuming, and expensive, even more so when high numbers (e.g., hundreds, thousands, millions) of computing devices have to be tested.

SUMMARY

The embodiments are directed to apparatus and methods to test and verify the wireless functionality of computing devices. For example, the embodiments may allow for the testing of the cellular connectivity of multiple cellular devices simultaneously, even when the cellular devices are being tested in radio frequency (RF) shielded test chambers (i.e., RF shielded test cabinets). The plurality of computing devices may differ, and may execute varying software (e.g., firmware, operating system (OS), etc.). The testing may include one or more verification and functional tests of the wireless functionality of the plurality of computing devices. Further, the embodiments may determine results (e.g., status) of each of the verification and functional tests, and may provide the results for display.

For instance, in some embodiments, a testing system includes a testing frame with a plurality of radio frequency (RF) shielded cabinets, each of the plurality of the RF shielded cabinets housing one or more antennae and a device under test. The testing system also includes a wireless simulation system electrically coupled to each antennae and configured to transmit one or more RF signals to each antennae through the electrical coupling. Further, the testing system includes a testing computing device commutatively coupled to each of the devices under test.

In some embodiments, an electrical circuit includes an RF combiner configured to combine at least two cellular signals to output a combined cellular signal. The electrical circuit also includes an amplifier configured to receive the combined cellular signal and output an amplified cellular signal. Further, the electrical circuit includes an RF splitter configured to receive the amplified cellular signal and provide the amplified cellular signal to each of a plurality of antennas located within RF shielded cabinets of a testing system.

In some embodiments, a method by a testing computing device includes transmitting a configuration request for configuration data to each of a plurality of devices, where each of the plurality of devices are located within a corresponding RF shielded cabinet. The method also includes receiving the configuration data from each of the plurality of devices. Further, the method includes generating a wireless status request for at least one status of a cellular signal of each of the plurality of devices based on the configuration data received for each of the plurality of devices. The method also includes transmitting the wireless status request to each of the plurality of devices. The method further includes receiving the at least one status of the cellular signal from each of the plurality of devices, and storing the at least one status of the cellular signal from each of the plurality of devices in a memory device. The method also includes determining a cellular status of each of the plurality of devices based on the corresponding status stored in the memory device. Further, the method includes providing for display the cellular status of each of the plurality of devices.

In some embodiments, a testing computing device includes a non-transitory, machine-readable storage medium storing instructions, and at least one processor communicatively coupled to the non-transitory, machine-readable storage medium. Further, the at least one processor is configured to execute the instructions to transmit a configuration request for configuration data to each of a plurality of devices, where each of the plurality of devices are located within a corresponding RF shielded cabinet. The at least one processor is also configured to execute the instructions to receive the configuration data from each of the plurality of devices. Further, the at least one processor is configured to execute the instructions to generate a wireless status request for at least one status of a cellular signal of each of the plurality of devices based on the configuration data received for each of the plurality of devices. The at least one processor is also configured to execute the instructions to transmit the wireless status request to each of the plurality of devices. The at least one processor is further configured to execute the instructions to receive the at least one status of the cellular signal from each of the plurality of devices, and store the at least one status of the cellular signal from each of the plurality of devices in a memory device. The at least one processor is also configured to execute the instructions to determine a cellular status of each of the plurality of devices based on the corresponding status stored in the memory. Further, the at least one processor is configured to execute the instructions to provide for display the cellular status of each of the plurality of devices.

In some embodiments, a non-transitory, machine-readable storage medium stores instructions that, when executed by at least one processor, cause the at least one processor to perform operations. The operations include transmitting a configuration request for configuration data to each of a plurality of devices, where each of the plurality of devices are located within a corresponding RF shielded cabinet. The operations also include receiving the configuration data from each of the plurality of devices. Further, the operations include generating a wireless status request for at least one status of a cellular signal of each of the plurality of devices based on the configuration data received for each of the plurality of devices. The operations also include transmitting the wireless status request to each of the plurality of devices. The operations further include receiving the at least one status of the cellular signal from each of the plurality of devices, and storing the at least one status of the cellular signal from each of the plurality of devices in a memory device. The operations also include determining a cellular status of each of the plurality of devices based on the corresponding status stored in the memory device. Further, the operations include providing for display the cellular status of each of the plurality of devices.

DETAILED DESCRIPTION OF THE EMBODIMENT(S)

Figure 1:
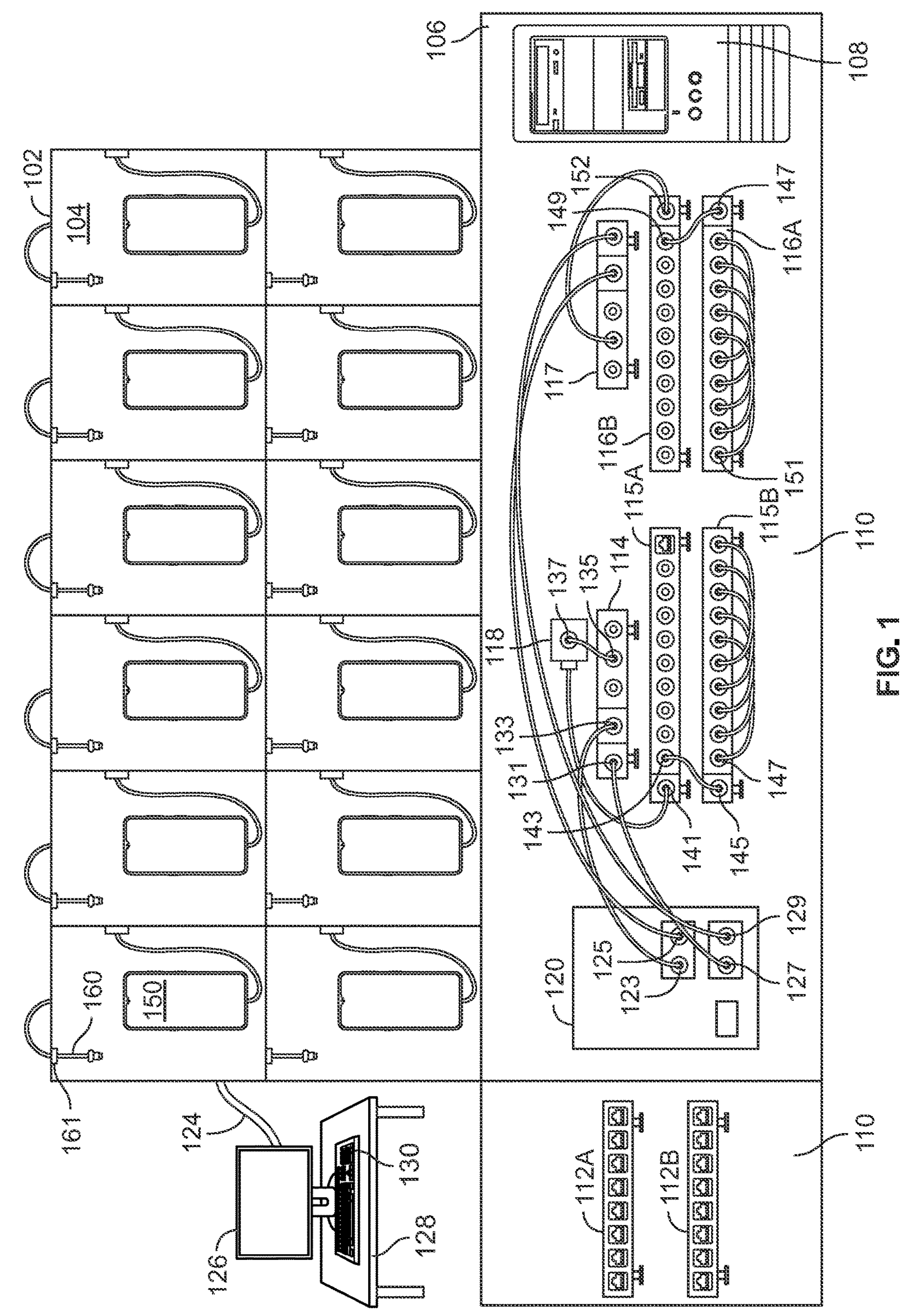
FIG. 1 illustrates a multiple device testing system, in accordance with some exemplary embodiments.

While the features, methods, devices, and systems described herein may be embodied in various forms, some exemplary and non-limiting embodiments are shown in the drawings, and are described below. Some of the components described in this disclosure are optional, and some implementations may include additional, different, or fewer components from those expressly described in this disclosure.

The embodiments described herein may allow for the automatic testing and verification of the wireless functionality of multiple devices under test (DUTs), as well as for the reporting of corresponding results. For instance, and as described herein, a testing system (e.g., testing assembly) may include a testing frame with a plurality of radio frequency (RF) shielded cabinets (e.g., RF shielded chambers). The RF shielded cabinets may prevent a range of RF waves from penetrating an interior of the cabinet. In addition, each cabinet may house one or more antennae and a device under test (DUT). The device under test may be any computing device, such as a cellular phone (e.g., smart phone), laptop, computer, tablet, smart watch, or any other device that can communicate wirelessly. Each RF shielded cabinet may also house additional equipment, such as a communication cable that attaches to the computing device under test. The communication cable may be, for instance, a universal serial bus (USB) (e.g., USB, USB 2.0, USB 3.0, etc.) cable (e.g., USB to USB, USB to Micro-USB, USB to USB-C, USB to lightning, etc.) that plugs into the device under test.

Additionally, the testing system may include a wireless network system (e.g., composed of one or more wireless networking components) that establish a wireless network. For instance, the wireless network system may be a cellular network simulation system that establishes a cellular network (e.g., 4G network, 5G network, etc.). Further, the wireless network system is electrically coupled to each of the antennas provided within the RF shielded cabinets. The wireless network system can provide, through one or more electrical circuits, a cellular signal to each of the antennas.

For instance, as described herein, an exemplary electrical circuit can include an RF combiner (e.g., an RF power combiner/splitter component, RF power combiner/splitter/divider component, 4-to-1 RF combiner, etc.) configured to combine at least two network signals, such as cellular signals, from the wireless network system and to output a combined network signal. For instance, the RF combiner may be capable of combining a 4G cellular network signal and a 5G cellular network signal. Further, the RF combiner may receive the network signals from the wireless network system over one or more communication cables. For instance, the RF combiner may receive a 4G signal over a first communication cable, and a 5G signal over a second communication cable. The electrical circuit also includes an amplifier configured to receive the combined cellular signal and output an amplified cellular signal (e.g., an input protected low noise amplifier). In some examples, the amplifier operates within a range of 30 MHz to 3000 MHz, and can provide up to 30 decibel (dB) of gain to an input signal with up to 1 Watt of RF input power.

Further, the electrical circuit includes an RF splitter (e.g., an RF power combiner/splitter component, RF power combiner/splitter/divider component, 12 way RF splitter) configured to receive the amplified network signal from the amplifier, and further configured to output the amplified network signal (e.g., via output ports) to each of the antennas located within the RF shielded cabinets over corresponding communication cables (e.g., coaxial cables, SMA cables, etc.). For instance, the amplified network signal may include frequencies between 400 MHz and 6000 MHz (e.g., 4G frequencies and/or 5G frequencies). The RF splitter may be operable to "split" the amplified network signal to provide the amplified network signal, which may include the frequencies between 400 MHZ and 6000 MHz, out of one or more output ports, where the amplified network signal may then be received by the antennas over the communication cables. In some examples, the frequencies include a 4G signal at 1960 MHz, and a 5G signal at 2593 MHz.

The electrical circuit may also include an additional RF combiner configured to receive, from each of one or more of the antennas, a receive signal (e.g., a signal detected from the device under test). The additional RF combiner may be electrically coupled to the antennas over corresponding communication cables, for example. In addition, the additional RF combiner can provide the received signals as a combined received signal to an additional RF splitter (e.g., a 1-to-4 RF splitter, a 1-to-2 RF splitter) over a communication cable. The additional RF splitter may be operable to "split" the combined received signal to provide the combined received signal (e.g., which may include 4G and/or 5G signals) via one or more output ports. The additional RF splitter may provide the combined received signal via the output ports to the wireless network system.

As described herein, in some examples, such as to expand the number of supported DUTs, the exemplary electrical circuit may include one or more additional components, such as one or more additional RF splitters and/or one or more additional RF combiners.

The testing system may also include a testing computing device (e.g., a master personal computer) that is commutatively coupled to each of the devices under test over a corresponding connection, such as a wired connection. For example, the testing computing device may include a port, such as a USB or Ethernet port. One end of a communication cable (e.g., USB cable, Ethernet cable, etc.) may be connected to the testing computing device's port, and the other end may be connected to a networking component, such as a hub or switch. Further, the networking component may also be communicatively coupled to each of the communication cables of the RF shielded cabinet. For instance, an end of each of the communication cables may extend out of the RF shielded cabinets and be connected to a corresponding port of the networking component. In some examples, for a given RF shielded cabinet, one end of an additional communication cable is connected to a port of the networking component, and the other end of the additional communication cable is electrically connected (e.g., via an adapter, additional networking component, etc.) to an end of the communication cable within the RF shielded cabinet.

The testing computing device may execute an application that causes the testing computing device to generate and transmit messages over the communication cables to the DUTs within the RF shielded cabinets. For instance, and as described herein, the testing computing device may generate and transmit a request to each DUT to obtain a configuration of the DUT. The request may cause the DUT to generate and transmit configuration data to the testing computing device. The configuration data may include, for example, a model of the DUT, a hardware version of the DUT, a software version of the DUT, or any other configuration information. The testing computing device may also generate and transmit a request for status, such as wireless status, to each DUT. Upon receiving a request for wireless status, each DUT may send, for instance, one or more wireless network status values. The wireless network status values may include, for example, a received signal strength indicator (RSSI), a reference signals received power (RSRP), or a reference signals received quality (RSRQ) of the wireless network (e.g., the wireless network provided by the wireless network system and transmitted by the antennae within the RF shielded cabinet of the DUT).

Referring to FIG. 1, a testing system 100 includes a testing frame 102 with a plurality of RF shielded cabinets 104 (i.e., RF shielded test chambers). Each RF shielded cabinet 104 may include a device under test (DUT) 150 and an antenna 160. The DUTs 150 can include, for instance, any type of cellular phone such as an Android® device or an iPhone® device, a computer such as Apple® computers, Windows® computers, and Macintosh® computers, any type of laptop such as Mac® laptops and Windows® laptops, any type of tablet, or any other suitable computing device. For example, one or more of the DUTs 150 may be of one type of computing device, and one or more of DUTs 150 may be of another type of computing device (e.g., where any one of the computer type, such as manufacturer and model, and operating system, differ from each other). Further, the testing computing device 108 may be any suitable computing device, such as a Windows® computer.

The testing frame 102 also includes a control cabinet 106 for storing a testing computing device 108, and one or more networking cabinets 110 for holding, for example, one or more extenders 112A, 112B (e.g., Ethernet hubs, USB hubs, switches, routers, etc.), one or more transmit-side RF combiners 114 (e.g., RF combiner, RF combiner and splitter), one or more transmit-side RF splitters 115A, 115B (e.g., RF splitter, RF splitter and combiner), one or more receive-side RF combiners 116A, 116B, one or more receive-side RF splitters 117, an RF amplification module 118, and a cellular simulation system 120. The one or more transmit-side RF combiners 114, one or more transmit-side RF splitters 115A, 115B, one or more receive-side RF combiners 116A, 116B, one or more receive-side RF splitters 117, and the RF amplification module 118 may form an electrical circuit that allows for the passing of RF signals between the cellular simulation system 120 and the antennas 160 within the plurality of device cabinets 104.

For example, the cellular simulation system 120 may be operable to provide at least two wireless networks, such as a 4G wireless network and a 5G wireless network. As illustrated, the cellular simulation system 120 may include a first wireless network transmit port 123 (e.g., 4G signal transmit port) and a first wireless network receive port 125 (e.g., 4G signal receive port). The cellular simulation system 120 may also include a second wireless network transmit port 127 (e.g., 5G signal transmit port) and a second wireless network receive port 129 (e.g., 5G signal receive port). The first wireless network transmit port 123, first wireless network receive port 125, second wireless network transmit port 127, and second wireless network receive port 129 may include SMA connectors, for example. Further, each of the first wireless network transmit port 123 and the second wireless network transmit port 127 may be electrically connected, via respective communication cables, to respective input ports 131, 133 of the transmit-side RF combiner 114. For instance, the first wireless network transmit port 123 and the second wireless network transmit port 127 may be connected to the input ports 131, 133 of the transmit-side RF combiner 114 using SMA cables. Further, the transmit-side RF combiner 114, which may be a 2-to-1 RF combiner, may combine the signals received from the first wireless network transmit port 123 and the second wireless network transmit port 127 to provide a combined RF signal through output port 135.

The RF amplification module 118 may be electrically connected to the transmit-side RF combiner 114, and may receive the combined RF signal. For example, a communication cable may connect the output port 135 of the transmit-side RF combiner 114 to an input port 137 of the RF amplification module 118. The RF amplification module 118 may include one or more electrical components, such as an amplifier, to amplify the combined RF signal received through the input port 137. Further, the RF amplification module 118 may provide the amplified RF signal through an output port 139.

Transmit-side RF splitter 115A may receive the amplified RF signal from the RF amplification module 118 via a communication cable connected on one end to the output port 139 of the RF amplification module 118 and on another end to an input port 141 of the transmit-side RF splitter 115A. Further, transmit-side RF splitter 115A may provide the amplified RF signal to one or more output ports 143. As illustrated, a cable, such as an SMA cable, connects an output port 143 of the transmit-side RF splitter 115A to an input port 145 of the transmit-side RF splitter 115B. Although only one output port 143 of the transmit-side RF splitter 115A is illustrated as connected to an input port 145 of a transmit-side RF splitter 115B, in some examples other output ports 143 of the transmit-side RF splitter 115A may be similarly connected to input ports 145 of other transmit-side RF splitters 115B.

The transmit-side RF splitter 115B receives the amplified RF signal from the transmit-side RF splitter 115A through the input port 145, and provides the amplified RF signal through one or more output ports 147. One or more of the output ports 147 may be electrically connected, via a corresponding cable (e.g., SMA cable), to an antenna 160 within one of the RF shielded cabinets 104. For example, one end of the cable may be connected to an output port 143 of the transmit-side RF splitter 115B, and another end of the cable may be connected to a connector 161, such as an SMA connector, that is coupled to an antenna 160.

As such, although each DUT 150 may be within an RF shielded cabinet 104, the testing system 100 is able to provide a network signal from the cellular simulation system 120 to the DUTs 150. Similarly, each of the antennas 160 may allow a corresponding DUT 150 to transmit a signal back to the cellular simulation system 120.

For example, each antennae 160 may be connected via a cable to a respective input port 151 of receive-side RF combiner 116A. Further, receive-side RF combiner 116A may combine any signals received via the input ports 151 to provide a combined received signal through an output port 147. Further, receive-side RF combiner 116B may be electrically connected to the output port 147, and may receive the combined received signal from the receive-side RF combiner 116A. For example, a cable, such as an SMA cable, may connect the output port 147 of the receive-side RF combiner 116A to an input port 149 of the receive-side RF combiner 116B. The receive-side RF combiner 116B may receive the combined received signal through the input port 149, and may provide the combined received signal to an output port 152. Although only one input port 149 is illustrated as connected, other input ports 149 of the receive-side RF combiner 116B may be similarly connected to output ports 147 of additional receive-side RF combiners 116A. As such, the receive-side RF combiner 116B may combine all of the signals received via the input ports 149, and may provide the combined signals through the output port 152.

Further, the receive-side RF splitter 117 may be electrically connected to the receive-side RF combiner 116B and may receive the combined received signal. For instance, as illustrated, an input port 153 of the receive-side RF splitter 117 may be connected via a cable, such as an SMA cable, to the output port 152 of the receive-side RF combiner 116B. The receive-side RF splitter 117 may receive the combined received signal through the input port, and provide the combined received signal to output ports 155, 157. As an example, the receive-side RF splitter 117 may provide a first output signal that includes a range of frequencies, such as frequencies between 600 MHZ and 3000 MHz (e.g., 4G frequencies), via the first output port 155, and a second output signal that includes another range of frequencies, such as frequencies between 3000 MHz and 6000 MHz (e.g., 5G frequencies), via the second output port 157. Additionally, the first output port 155 is electrically connected, via a cable (e.g., SMA cable), to the first wireless network receive port 125 of the cellular simulation system 120, and the second output port 157 is electrically connected, via a cable (e.g., SMA cable), to the second wireless network receive port 129 of the cellular simulation system 120. As such, the cellular simulation system 120 may receive an RF signal from each DUT 150, for example, simultaneously (i.e., within the combined received signal).

In addition, the testing system 100 may include a bracket 124 for securing a monitor 126 and a shelf 128 for a keyboard 130, which are communicatively coupled to the testing computing device 108. For instance, each of the monitor 126 and keyboard 130 may connect to the testing computing device 108 through a corresponding cable, such as a USB cable. In some instances, the testing computing device 108 may be communicatively coupled to the cellular simulation system 120. For instance, the testing computing device 108 may connect to the cellular simulation system 120 via a cable, such as a USB or Ethernet cable, either directly or through an extender 112A.

The testing computing device 108 may execute instructions (e.g., an application) to perform one or more of the operations described herein. For example, testing computing device 108 may generate, for each of the DUTs 150, a configuration request message. Testing computing device 108 may transmit the configuration request message to each of the DUTs 150 (e.g., via an extender 112A, 112B). When received by a DUT 150, the configuration request message causes the DUT 150 to generate and transmit configuration data to testing computing device 108. Configuration data may include, among other things, one or more of a device type, a model number, a serial number, name of an operating system, and a year of manufacturer.

In some examples, testing computing device 108 may generate, for one or more of the DUTs 150, a wireless status request message. Testing computing device 108 may transmit the wireless status request message to one or more of the DUTs 150 (e.g., via an extender 112A). When received by a DUT 150, the wireless status request message causes the DUT 150 to transmit one or more wireless network status values (e.g., RSSI, RSRP, RSRQ, a registration status, etc.). For instance, upon receiving a wireless status request message, a DUT 150 may determine one or more of the wireless network status values, and may generate and transmit to the testing computing device 108 a wireless status response message that includes the one or more wireless network status values. Each of the configuration request message and wireless status request message may be generated to correspond to a protocol supported by the DUTs 150.

In some instances, testing computing device 108 generates and displays a graphical user interface (GUI) on monitor 126 that allows a user to initiate one or more of the operations described herein. For instance, the GUI may allow the user to select one or more of the operations described herein (e.g., configuration request, wireless status request), and may also allow the user to select one or more of the DUTs 150 for which to perform the operations. Upon engaging a "start" icon (e.g., based on an input from the keyboard 130 selecting the "start icon"), testing computing device 108 automatically carries out the enabled operations for the selected DUTs 150.

In some examples, testing computing device 108 provides for display a status of each of the DUTs 150. For instance, testing computing device 108 may provide for display a wireless status of one or more DUTs 150 based on received wireless status response messages. Testing computing device 108 may cause the wireless status to be displayed, for instance, within the GUI on monitor 126. In some instances, testing computing device 108 transmits the wireless status to another computing device, such as by transmitting an email, short message service (SMS) communication (e.g., text), or any other suitable message (e.g., over a wireless communication network (e.g., WiFi®, Bluetooth®, etc.), or a wired connection (e.g., Ethernet connection, etc.)).

Figure 2:
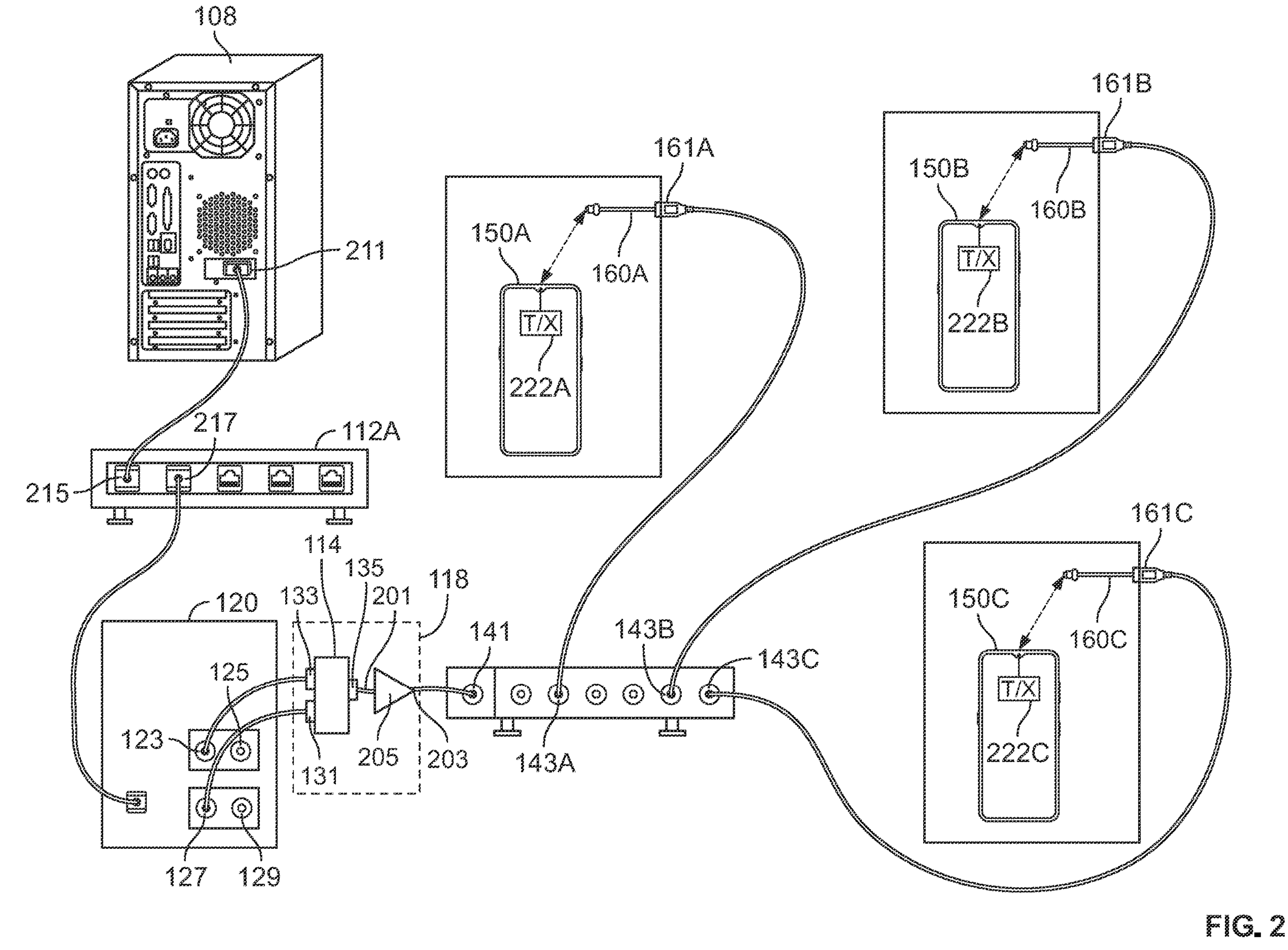
FIG. 2 illustrates exemplary portions of the multiple device testing system of FIG. 1, in accordance with some exemplary embodiments.

FIG. 2 illustrates exemplary portions of the testing system 100 of FIG. 1. As illustrated, the testing computing device 108 is communicatively coupled to the extender 112A via a cable, such as a USB cable, that connects on one end to a port 211 (e.g., USB port) of the testing computing device 108 and on another end to a port 215 of the extender 112A. Similarly, the cellular simulation system 120 is communicatively coupled to the extender 112A via a cable that connects on one end to a port 217 of the extender 112A, and on another end to a port 213 of the cellular simulation system 120.

Further, the first wireless network transmit port 123 of the cellular simulation system 120, which may provide a 4G signal, is connected to the input port 133 of the transmit-side RF combiner 114 with a cable (e.g., a SMA cable), and the second wireless network transmit port 127 of the cellular simulation system 120, which may provide a 5G signal, is connected to the input port 131 of the transmit-side RF combiner 114 with another cable. As described herein, the transmit-side RF combiner 114 may combine the RF signals received on the input ports 131, 133 to provide a combined RF signal through the output port 135. In addition, the output port 135 of the transmit-side RF combiner 114 is electrically connected to an input 201 of an amplifier 205. Further, an output 203 of the amplifier 205 is electrically connected to input port 141 of the transmit-side RF splitter 115A.

Additionally, the transmit-side RF splitter 115A can provide an RF signal received from the amplifier 205 to multiple RF shielded cabinets 104, such as RF shielded cabinet 104A, RF shielded cabinet 104B, and RF shielded cabinet 104C. For instance, as illustrated, a cable (e.g., SMA cable) may connect an output port 143A of the transmit-side RF splitter 115A to a connector 161A of antennae 160A within the RF shielded cabinet 104A. Similarly, a cable may connect an output port 143B of the transmit-side RF splitter 115A to a connector 161B of antennae 160B within the RF shielded cabinet 104B. Further, another cable may connect an output port 143C of the transmit-side RF splitter 115A to a connector 161C of antennae 160C within the RF shielded cabinet 104C.

As such, RF signals generated by the cellular simulation system 120 and provided through the first wireless network transmit port 123 and the second wireless network transmit port 127 are transmitted by the antennas 160A, 160B, 160C located within the RF shielded cabinets 104A, 104B, 104C, respectively. Further, each of the DUTs 150A, 150B, 150C may receive the RF signals as transmitted by the corresponding antennas 160A, 160B, 160C. For instance, a transceiver 222A of DUT 150A may receive the RF signals from the antennae 160A. Similarly, a transceiver 222B of DUT 150B may receive the RF signals from the antennae 160B, and a transceiver 222C of DUT 150C may receive the RF signals from the antennae 160C.

Figure 3:
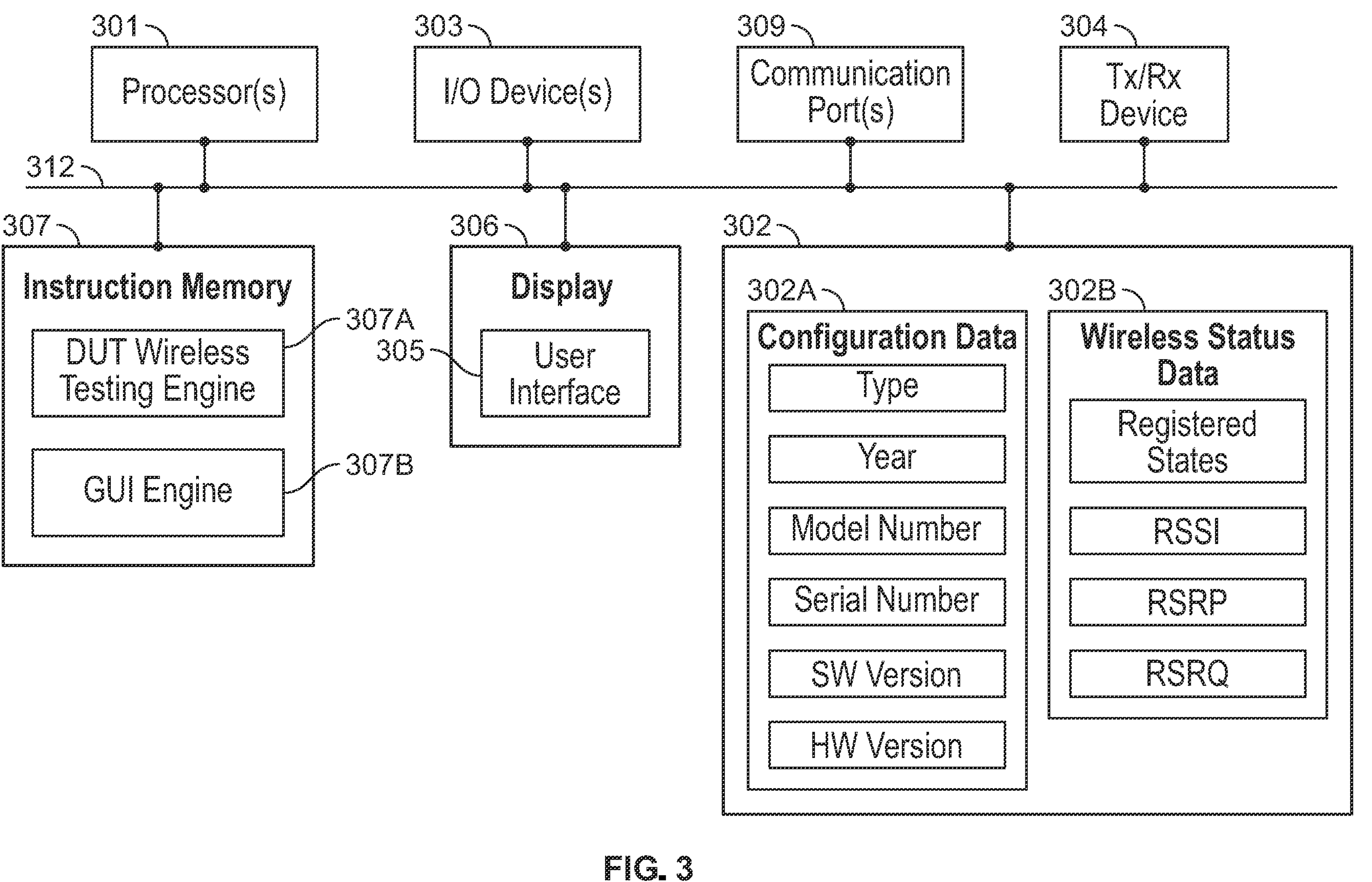
FIG. 3 illustrates a block diagram of a testing computing device, in accordance with some embodiments.

FIG. 3 illustrates an example of the testing computing device 108 of FIGS. 1 and 2. Testing computing device 108 can include one or more processors 301, working memory 302, one or more input-output devices 303, instruction memory 307, a transceiver 304, one or more communication ports 309, and a display 306, all operatively coupled to one or more data buses 312. Data buses 312 allow for communication among the various devices, and can include wired, or wireless, communication channels.

Processors 301 can include one or more distinct processors, each having one or more cores. Each of the distinct processors can have the same or different structure. For example, processors 301 can include one or more central processing units (CPUs), one or more graphics processing units (GPUs), one or more application specific integrated circuits (ASICs), one or more digital signal processors (DSPs), and the like. Further, processors 301 can be configured to perform a certain function or operation by executing code, stored on instruction memory 307, embodying the function or operation. For example, processors 301 can be configured to perform one or more of any function, method, or operation disclosed herein.

Instruction memory 307 can store instructions that can be accessed (e.g., read) and executed by one or more processors 301. For example, instruction memory 307 can be a non-transitory, computer-readable storage medium such as a read-only memory (ROM), an electrically erasable programmable read-only memory (EEPROM), flash memory, a removable disk, CD-ROM, any non-volatile memory, or any other suitable memory. In this example, instruction memory 307 includes a DUT wireless testing engine 307A and a GUI engine 307B.

DUT wireless testing engine 307A may include instructions that, when executed by one or more of processors 301, cause the one or more processors 301 to perform operations to generate and transmit configuration request and wireless status request messages to DUTs 150, as well as receive and process configuration data and wireless network status values, as described herein. In addition, GUI engine 307B can include instructions that, when executed by one or more of processors 301, cause the one or more processors 301 to perform operations to generate a user interface 305, and to display the user interface 305 on display 306 (e.g., monitor 126). Further, the executed GUI engine 307B may allow a user to select operations to be performed on one or more DUTs 150, as well as to view status, such as wireless status, of the one or more DUTs 150, as described herein.

Additionally, processors 301 can store data to, and read data from, working memory 302. For example, processors 301 can store a working set of instructions to working memory 302, such as instructions loaded from instruction memory 307. Processors 301 can also use working memory 302 to store dynamic data created during the operation of testing computing device 108. Working memory 302 can be a random access memory (RAM) such as a static random access memory (SRAM) or dynamic random access memory (DRAM), or any other suitable memory.

As illustrated in this example, working memory 302 includes configuration data 302A and wireless status data 302B. Configuration data 302A may include configuration data for DUTs 150, such as configuration data received in response to configuration request messages, as described herein. Configuration data 302A may include, for each DUT 150, one or more of a device type (e.g., personal computer, laptop, tablet, etc.), a year of manufacturer, a model number, a serial number, a software version, and a hardware version, among any other device identifying information. Wireless status data 302B may include, for each DUT 150, one or more wireless status values that characterize a wireless connection, such as a cellular connection (e.g., as provided by antennas 160). For instance, wireless status data 302B may include one or more of a registered status (e.g., registered with the wireless connection), RSSI, RSRP, and RSRQ values.

Input-output devices 303 can include any suitable device that allows for data input or output. For example, input-output devices 303 can include one or more of a keyboard, a touchpad, a mouse, a stylus, a touchscreen, a physical button, a microphone, or any other suitable input or output device.

Communication port(s) 309 can include, for example, a serial port such as a Universal Serial Bus (USB) port, an Ethernet port, a universal asynchronous receiver/transmitter (UART) port, or any other suitable communication port or connection. In some examples, communication port(s) 309 allows for the programming of executable instructions in instruction memory 307. In some examples, communication port(s) 309 allow for the transfer (e.g., uploading or downloading) of data, such as data stored within working memory 302.

Display 306 can display user interface 305. User interface 305 can enable user interaction with testing computing device 108. For example, user interface 305 can be a user interface for an application that allows the user to enable one or more operations, and to select one or more DUTs 150, as described herein. In some examples, a user can interact with user interface 305 by engaging input-output devices 303. In some examples, display 306 can be a touchscreen, where user interface 305 is displayed on the touchscreen.

Transceiver 304 allows for communication with a network, such as a wireless communication network (e.g., WiFi®, Bluetooth®, etc.). The one or more processors 301 are operable to receive data from, and send data to, a wireless network via transceiver 304.

Figure 4A:
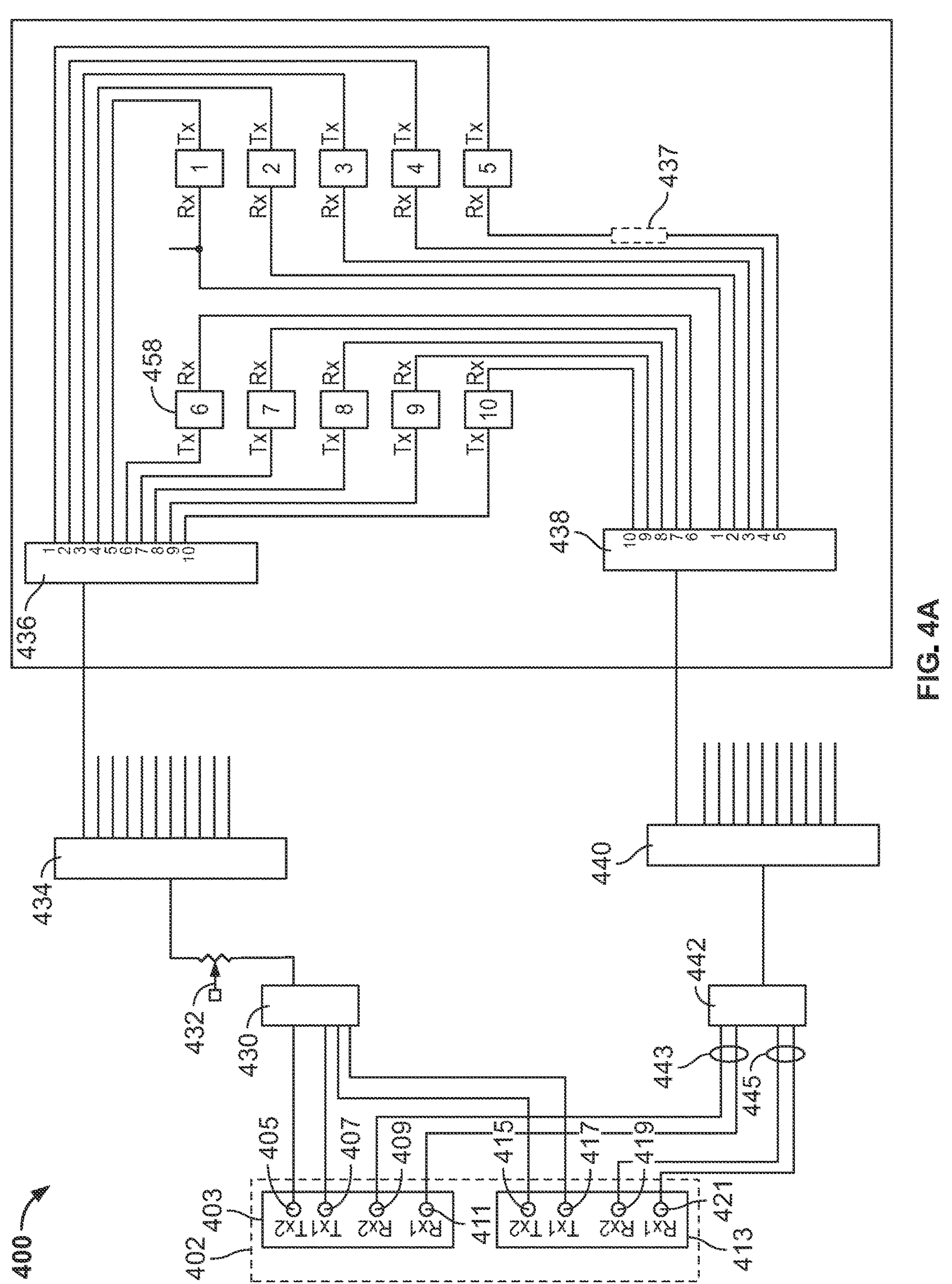
FIGS. 4A and 4B illustrate electrical circuits, in accordance with some embodiments.
Figure 4B:
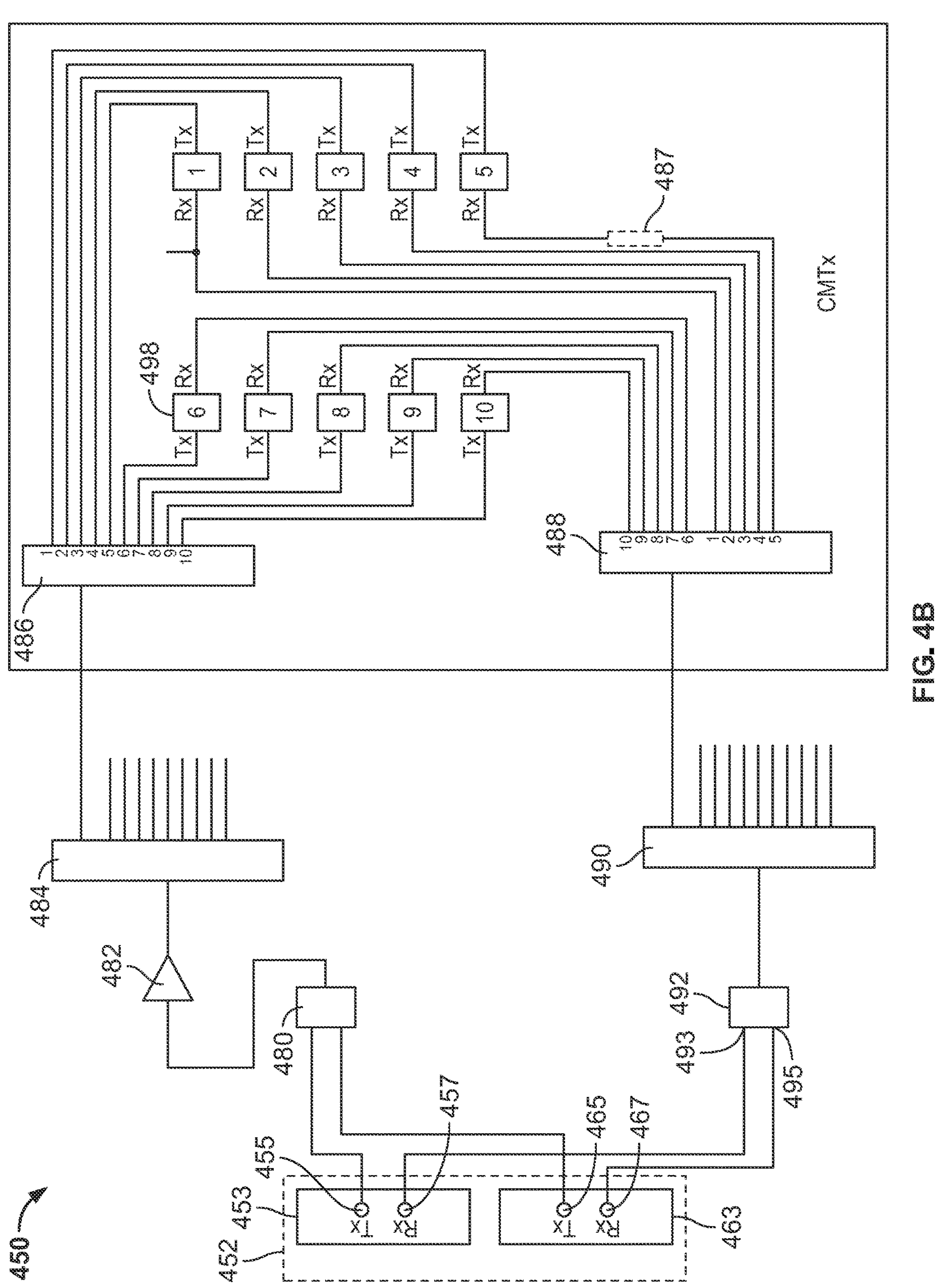

FIGS. 4A and 4B illustrate exemplary electrical circuits that can be used to provide a wireless network to devices within RF shielded cabinets, such as to DUTs 150 inside RF shielded cabinets 104. For instance, and with reference to FIG. 4A, an electrical circuit 400 includes a first wireless network interface 403 (e.g., wireless interface card) and a second wireless network interface 413 of a cellular simulation system 402. The first wireless network interface 403 may allow for the transmitting and receiving of a first range of RF frequencies (e.g., 4G frequencies), while the second wireless network interface 413 may allow for the transmitting and receiving of a second range of RF frequencies (e.g., 5G frequencies).

As illustrated, the first wireless network interface 403 may include a first transmit port 405 and a second transmit port 407 that output an RF signal (e.g., within the first range of RF frequencies). The first wireless network interface 403 may also include a first receive port 409 and a second receive port 411 that can receive an RF signal (e.g., within the first range of RF frequencies). Similarly, the second wireless network interface 413 may include a first transmit port 415 and a second transmit port 417 that output an RF signal (e.g., within the second range of RF frequencies). The second wireless network interface 413 may also include a first receive port 419 and a second receive port 421 that can receive an RF signal (e.g., within the second range of RF frequencies).

An RF combiner 430 (e.g., a four-to-one combiner) is electrically coupled to the first transmit port 405 and the second transmit port 407 of the first wireless network interface 403, and to the first transmit port 415 and the second transmit port 417 of the second wireless network interface 413. The RF combiner 430 may receive, and combine, RF signals received from each of the transmit ports of the first wireless network interface 403 and the second wireless network interface 413 of the cellular simulation system 402, and may output the combined RF signal. An output port of the RF combiner 430, which provides the combined RF signal, is electrically coupled to an attenuator 432 (e.g., a variable attenuator) and to an RF splitter 434 (e.g., a one-to-twelve RF splitter). For example, the combined RF signal, when output by the RF combiner 430, may proceed through the attenuator 432 before proceeding as an input to the RF splitter 434.

Further, one or more output ports of the RF splitter 434 may be electrically coupled to an input port of another RF splitter, such as RF splitter 436. Further, one or more output ports of the RF splitter 436 are electrically coupled to an antenna of a respective RF shielded cabinet 448 that houses a DUT, such as a DUT 150. The cascading of RF splitters, such as RF splitters 434, 436, allows for the testing of additional DUTs.

In addition, the antennas of the RF shielded cabinets 448 may be electrically coupled to input ports of RF combiner 438 (e.g., a twelve-to-one RF combiner). The antennas may receive RF signals (e.g., RF transmissions) from the corresponding DUTs within the RF shielded cabinets 448, and may provide the RF signals to respective input ports of the RF combiner 438. The RF combiner 438 may combine the received RF signals, and may output the combined RF signal. As illustrated, an output port of the RF combiner 438 is electrically coupled to an input port of RF combiner 440 (e.g., a twelve-to-one RF combiner). The RF combiner 440 combines any received RF signals, and provides the combined RF signal, via an output port, to RF splitter 442 (e.g., a one-to-four splitter).

RF splitter 442 may receive the combined RF signal from the RF combiner 438, and may provide the combined RF signal to first output ports 443 and second output ports 445. For example, the RF splitter 442 may provide the combined RF signal, which may include the first range of frequencies (e.g., 4G frequencies), through first output ports 443, and may provide the combined RF signal, which may include the second range of frequencies (e.g., 5G frequencies), through second output ports 445. The first output ports 443 of the RF splitter 442 are electrically coupled to the first receive port 409 and the second receive port 411 of the first wireless network interface 403. Likewise, the second output ports 445 of the RF splitter 442 are electrically coupled to the first receive port 419 and the second receive port 421 of the second wireless network interface 413. As such, the electrical circuit 400 facilitates the transmitting and receiving of cellular signals between the cellular simulation system 402 and multiple DUTs 150 within RF shielded cabinets 498.

FIG. 4B illustrates an electrical circuit 450 includes a first wireless network interface 453 (e.g., wireless interface card) and a second wireless network interface 463 of a cellular simulation system 452. The first wireless network interface 453 may allow for the transmitting and receiving of a first range of RF frequencies (e.g., 4G frequencies), while the second wireless network interface 463 may allow for the transmitting and receiving of a second range of RF frequencies (e.g., 5G frequencies).

As illustrated, the first wireless network interface 453 may include a transmit port 455 that outputs an RF signal (e.g., within the first range of RF frequencies). The first wireless network interface 453 may also include a receive port 457 that can receive an RF signal (e.g., within the first range of RF frequencies). Similarly, the second wireless network interface 463 may include a transmit port 465 that outputs an RF signal (e.g., within the second range of RF frequencies). The second wireless network interface 463 may also include a receive port 467 that can receive an RF signal (e.g., within the second range of RF frequencies).

An RF combiner 480 (e.g., a two-to-one combiner) is electrically coupled to the transmit port 455 of the first wireless network interface 453, and to the transmit port 465 of the second wireless network interface 463. The RF combiner 480 may receive, and combine, RF signals received from the transmit ports of the first wireless network interface 453 and the second wireless network interface 463 of the cellular simulation system 405, and may output the combined RF signal. An output port of the RF combiner 480, which provides the combined RF signal, is electrically coupled to an amplifier 482 (e.g., a variable attenuator) and to an RF splitter 484 (e.g., a one-to-twelve RF splitter). For example, the combined RF signal, when output by the RF combiner 480, may be amplified by the amplifier 482 before proceeding as an input to the RF splitter 484.

Further, one or more output ports of the RF splitter 484 may be electrically coupled to an input port of another RF splitter, such as RF splitter 486. Further, one or more output ports of the RF splitter 486 are electrically coupled to an antenna of a respective RF shielded cabinet 498 that houses a DUT, such as a DUT 150. The cascading of RF splitters, such as RF splitters 484, 486, allows for the testing of additional DUTs.

In addition, the antennas of the RF shielded cabinets 498 may be electrically coupled to input ports of RF combiner 488 (e.g., a twelve-to-one RF combiner). The antennas may receive RF signals (e.g., RF transmissions) from the corresponding DUTs within the RF shielded cabinets 498, and may provide the RF signals to respective input ports of the RF combiner 488. The RF combiner 488 may combine the received RF signals, and may output the combined RF signal. As illustrated, an output port of the RF combiner 488 is electrically coupled to an input port of RF combiner 490 (e.g., a twelve-to-one RF combiner). The RF combiner 490 combines any received RF signals, and provides the combined RF signal, via an output port, to RF splitter 492 (e.g., a one-to-two splitter).

RF splitter 492 may receive the combined RF signal from the RF combiner 488, and may provide the combined RF signal to first output port 493 and second output port 495. For example, the RF splitter 492 may provide the combined RF signal, which may include the first range of frequencies (e.g., 4G frequencies), through first output ports 493, and may provide the combined RF signal, which may include the second range of frequencies (e.g., 5G frequencies), through second output ports 495. The first output port 493 of the RF splitter 492 is electrically coupled to the receive port 457 of the first wireless network interface 453. Likewise, the second output port 495 of the RF splitter 492 is electrically coupled to the receive port 467 of the second wireless network interface 463. As such, the electrical circuit 450 facilitates the transmitting and receiving of cellular signals between the cellular simulation system 452 and multiple DUTs 150 within RF shielded cabinets 498.

Figure 5:
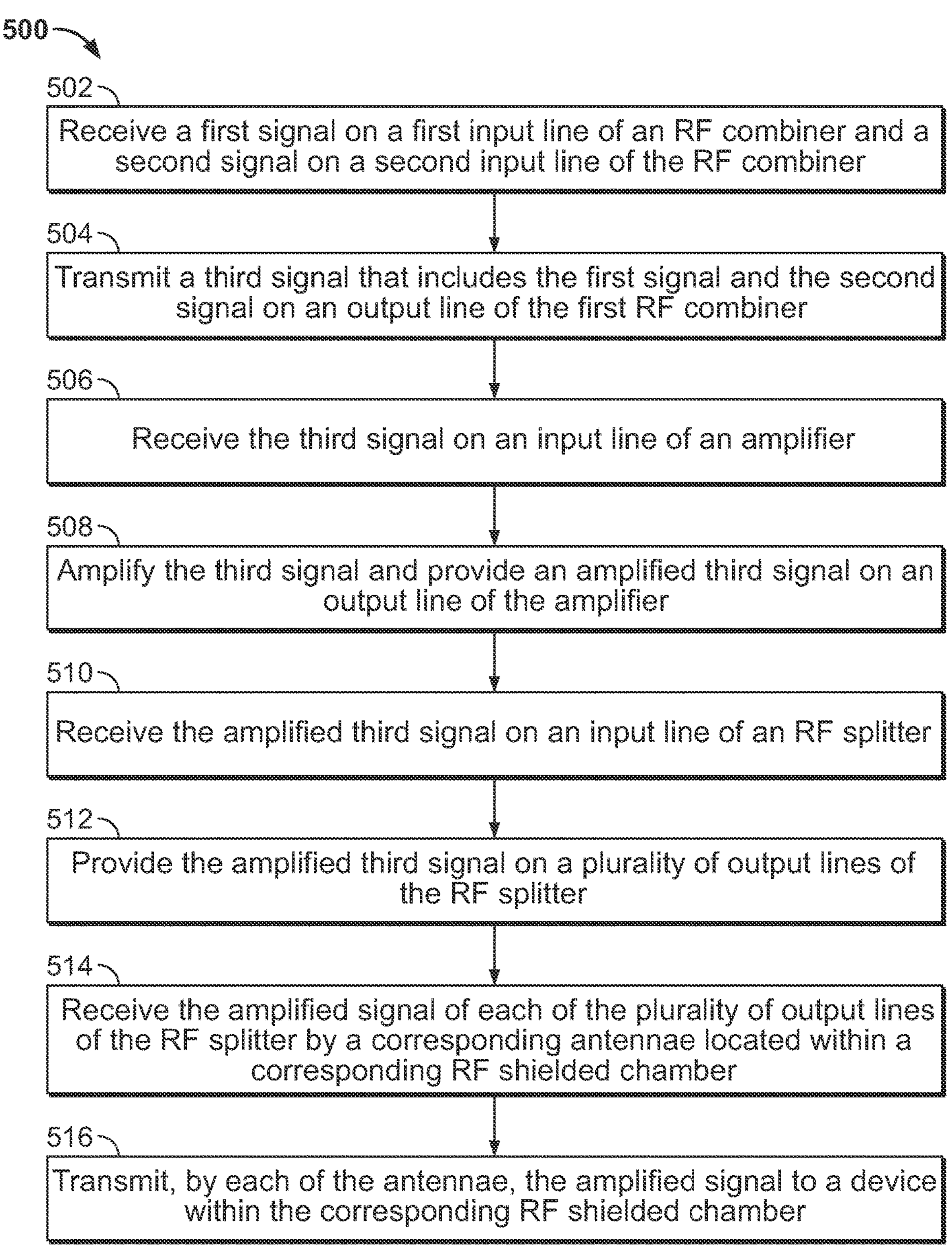
FIG. 5 is a flowchart of an exemplary process by one or more electrical circuits, in accordance with some embodiments.

FIG. 5 is a flowchart of an exemplary process 500 to simultaneously provide a wireless signal to a plurality of devices under test, such as smartphones. Beginning at block 502, an electrical circuit receives a first signal on a first input line of an RF combiner, and a second signal on a second input line of the RF combiner. At block 504, the electrical circuit transmits a third signal that includes the first signal and the second signal on an output line of the RF combiner.

Further, at block 506, the electrical circuit receives the third signal on an input line of an amplifier. At block 508, the amplifier of the electrical circuit amplifies the third signal and provides an amplified third signal on an output line. Additionally, at block 510, the electrical circuit receives the amplified third signal on an input line of an RF splitter. At block 512, the electrical circuit provides the amplified third signal on a plurality of output lines of the RF splitter.

At block 514, the electrical circuit receives the amplified signal of each of the plurality of output lines of the RF splitter at a corresponding antennae located within a corresponding RF shielded cabinet. Further, at block 516, each antennae of the electrical circuit transmits the amplified signal to a device within the corresponding RF shielded cabinet.

Figure 6:
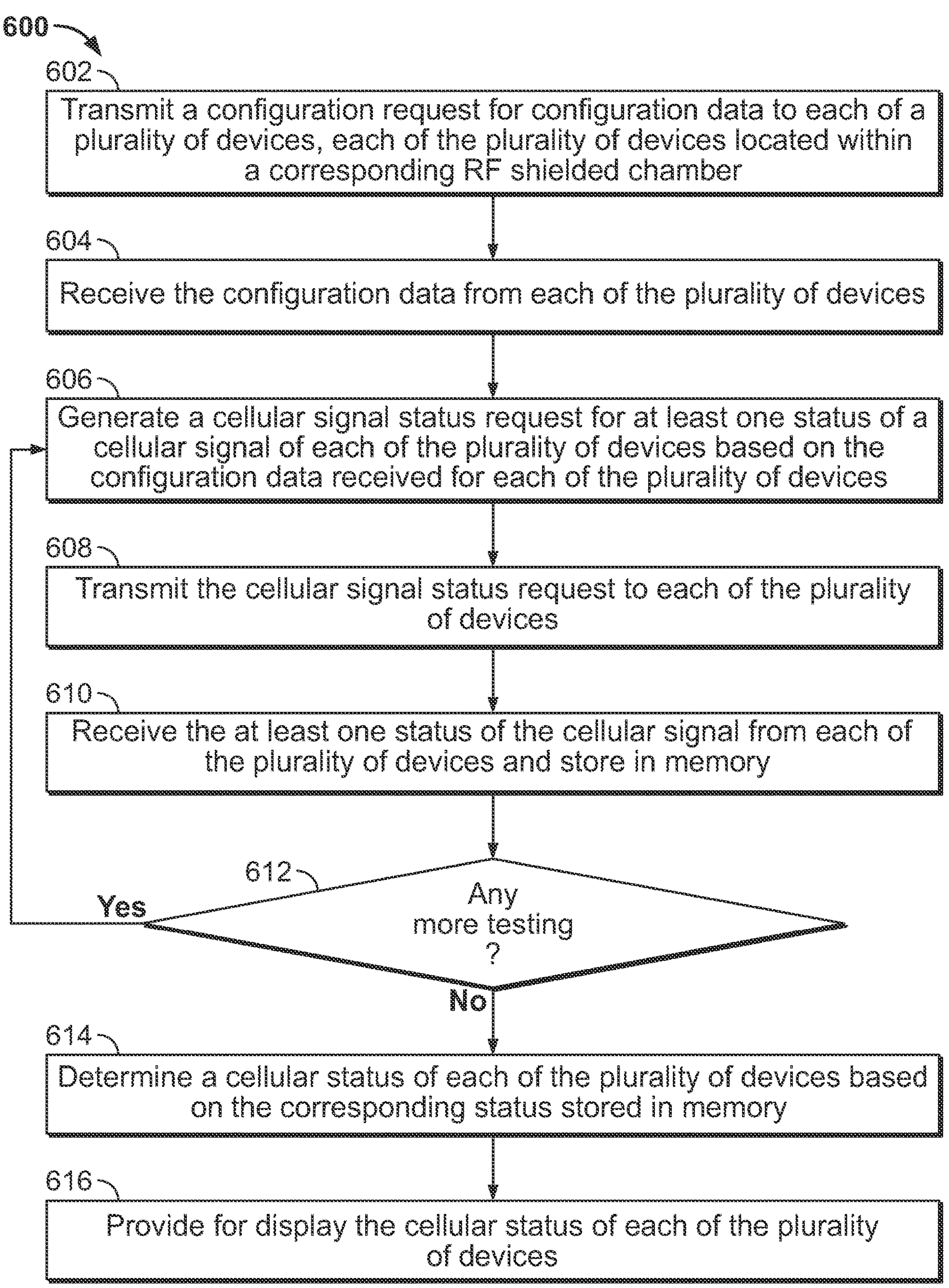
FIG. 6 is a flowchart of an exemplary process for determining a wireless status of a plurality of devices under test, in accordance with some embodiments.

FIG. 6 is a flowchart of an exemplary process 600 to provide for display the wireless connectivity status of a plurality of devices under test. Exemplary process 600 may be carried out by the testing computing device 108, for example. Beginning at block 602, testing computing device 108 transmits a configuration request for configuration data to each of a plurality of devices, where each of the plurality of devices are located within a corresponding RF shielded cabinet. At block 604, the testing computing device 108 receives the configuration data from each of the plurality of devices.

Further, at block 606 the testing computing device 108 generates a wireless status request for at least one status of a cellular signal of each of the plurality of devices based on the configuration data received for each of the plurality of devices. At block 608, the testing computing device 108 transmits the wireless status request to each of the plurality of devices.

Proceeding to block 610, the testing computing device 108 receives the at least one status of the cellular signal from each of the plurality of devices, and stores the received status in memory. At block 612, the testing computing device 108 determines whether any additional testing is to be performed for the plurality of devices. If additional testing is to be performed, the method proceeds back to block 606. If, however, testing is complete, the method proceeds to block 614.

At block 614, the testing computing device 108 determines a cellular status of each of the plurality of devices based on the corresponding status stored in memory. Further, at block 616, the testing computing device 108 provides for display the cellular status of each of the plurality of devices.

Advantageously, the embodiments described herein allow for the providing of a wireless network, such as a cellular network, to a plurality of devices that are enclosed within RF shielded cabinets. The embodiments may also allow for the testing of the wireless functionality of the plurality of devices using the established wireless network, as well as for determining the wireless connectivity status of the plurality of devices.

Although the methods described above are with reference to the illustrated flowcharts, it will be appreciated that many other ways of performing the acts associated with the methods can be used. For example, the order of some operations may be changed, and some of the operations described may be optional.

In addition, the methods and system described herein can be at least partially embodied in the form of computer-implemented processes and apparatus for practicing those processes. The disclosed methods may also be at least partially embodied in the form of tangible, non-transitory machine-readable storage media encoded with computer program code. For example, the steps of the methods can be embodied in hardware, in executable instructions executed by a processor (e.g., software), or a combination of the two. The media may include, for example, RAMs, ROMs, CD-ROMs, DVD-ROMs, BD-ROMs, hard disk drives, flash memories, or any other non-transitory machine-readable storage medium. When the computer program code is loaded into and executed by a computer, the computer becomes an apparatus for practicing the method. The methods may also be at least partially embodied in the form of a computer into which computer program code is loaded or executed, such that, the computer becomes a special purpose computer for practicing the methods. When implemented on a general-purpose processor, the computer program code segments configure the processor to create specific logic circuits. The methods may alternatively be at least partially embodied in application specific integrated circuits for performing the methods.

The foregoing is provided for purposes of illustrating, explaining, and describing embodiments of these disclosures. Modifications and adaptations to these embodiments will be apparent to those skilled in the art and may be made without departing from the scope or spirit of these disclosures.

What is claimed:

1. An apparatus comprising:

a testing frame comprising a plurality of radio frequency (RF) shielded cabinets, each of the plurality of RF shielded cabinets housing an antenna and a device under test;

wherein the electrical coupling distributes the one or more RF signals to the antennas via dedicated signal paths corresponding to respective RF shielded cabinets;

a wireless simulation system electrically coupled to each antennae and configured to transmit one or more RF signals to each antennae through the electrical coupling;

wherein the electrical coupling distributes the one or more RF signals to the antennas without RF switching between the RF shielded cabinets; and a testing computing device commutatively coupled to each of the devices under test and configured to determine a wireless connectivity status for each of the devices under test concurrently.

2. The apparatus of claim 1, wherein the one or more RF signals comprise a first RF signal and a second RF signal, and wherein the wireless simulation system is electrically coupled to each antennae by an electrical circuit configured to receive the first RF signal and the second RF signal from the wireless simulation system.

3. The apparatus of claim 2, wherein the electrical circuit comprises at least one RF combiner configured to combine the first RF signal and the second RF signal to output a combined RF signal.

4. The apparatus of claim 3, wherein the electrical circuit comprises an amplifier configured to receive the combined RF signal and output an amplified RF signal.

5. The apparatus of claim 3, wherein the electrical circuit comprises at least one RF splitter configured to:

receive the amplified RF signal; and output the amplified RF signal to each of the antennas located within the RF shielded cabinets.

6. The apparatus of claim 2, wherein the electrical circuit comprises at least one RF combiner configured to:

receive, from each of the antennas, a third RF signal; and combine the received third RF signals to output a combined RF signal.

7. The apparatus of claim 6, wherein the electrical circuit comprises at least one RF splitter configured to:

receive the combined RF signal;

output to the wireless simulation system a first RF output signal comprising a first portion of the combined RF signal having a first range of frequencies; and output to the wireless simulation system a second RF output signal comprising a second portion of the combined RF signal having a second range of frequencies.

8. The apparatus of claim 6, wherein the electrical circuit comprises at least one attenuator configured to:

attenuate one of the third RF signals; and output the attenuated one of the third RF signals to the at least one RF combiner.

9. The apparatus of claim 1, wherein the wireless simulation system is a cellular simulation system, and wherein the one or more RF signals comprise a first cellular signal and a second cellular signal.

10. The apparatus of claim 9, wherein the first cellular signal is a 4G signal, and the second cellular signal is a 5G signal.

11. The apparatus of claim 1, wherein the testing computing device is configured to transmit a request for wireless connectivity status from each of the devices under test, and receive, in response to the requests, wireless status data from each of the devices under test.

12. An electrical circuit comprising:

a radio frequency (RF) combiner configured to combine at least two cellular signals to output a combined cellular signal;

an amplifier configured to receive the combined cellular signal and output an amplified cellular signal; and an RF splitter configured to receive the amplified cellular signal and provide the amplified cellular signal directly to each of a plurality of antennas located within RF shielded chambers of a testing system;

wherein each RF shielded chamber houses exactly one antenna and exactly one device under test.

13. The electrical circuit of claim 12, wherein the RF combiner is configured to receive the at least two cellular signals from a cellular simulation system.

14. The electrical circuit of claim 13, wherein the at least two cellular signals comprise a 4G signal and a 5G signal.

15. The electrical circuit of claim 12, wherein the electrical circuit comprises a second RF combiner configured to:

receive, from each of the plurality of antennas, a third cellular signal; and combine the third cellular signals to output a combined third cellular signal.

16. The electrical circuit of claim 15, wherein the electrical circuit comprises an RF splitter configured to:

receive the combined third cellular signal from the second RF combiner;

output to a cellular simulation system a first output cellular signal comprising a first portion of the combined third cellular signal having a first range of frequencies; and output to the cellular simulation system a second output cellular signal comprising a second portion of the combined third cellular signal having a second range of frequencies.

* * * * *